United States Patent
Kang et al.

(10) Patent No.: US 6,906,975 B2
(45) Date of Patent: Jun. 14, 2005

(54) REFERENCE VOLTAGE GENERATING CIRCUIT OF NONVOLATILE FERROELECTRIC MEMORY DEVICE

(75) Inventors: Hee Bok Kang, Daejeon-shi (KR); Hun Woo Kye, Kyonggi-do (KR); Duck Ju Kim, Cheju-do (KR); Je Hoon Park, Kyonggi-do (KR)

(73) Assignee: Hynix Semiconductor Inc., Ichon-shi (KR)

(*) Notice: Subject to any disclaimer, the term of this patent is extended or adjusted under 35 U.S.C. 154(b) by 334 days.

(21) Appl. No.: 10/207,197

(22) Filed: Jul. 30, 2002

(65) Prior Publication Data

US 2003/0026154 A1 Feb. 6, 2003

(30) Foreign Application Priority Data

Aug. 6, 2001 (KR) ...................................... P2001-47263

(51) Int. Cl.⁷ ................................................ G11C 7/04
(52) U.S. Cl. ........................ 365/211; 365/213; 365/145; 365/210
(58) Field of Search ................................ 365/211, 210, 365/213, 145

(56) References Cited

U.S. PATENT DOCUMENTS

| | | | |
|---|---|---|---|
| 5,978,250 A | | 11/1999 | Chung et al. |
| 6,097,624 A | | 8/2000 | Chung et al. |
| 6,205,074 B1 | * | 3/2001 | Van Buskirk et al. ...... 365/211 |
| 6,215,693 B1 | | 4/2001 | Chung et al. |
| 6,272,037 B1 | * | 8/2001 | Miyamoto ................... 365/145 |
| 6,577,549 B1 | * | 6/2003 | Tran et al. ................... 365/211 |
| 6,600,675 B2 | * | 7/2003 | Kang et al. .................. 365/145 |
| 6,775,196 B2 | * | 8/2004 | Perner et al. ................ 365/211 |

FOREIGN PATENT DOCUMENTS

| | | |
|---|---|---|
| JP | 11-273360 | 10/1999 |
| JP | 11-306765 | 11/1999 |
| JP | 11-353898 | 12/1999 |

* cited by examiner

Primary Examiner—Connie C. Yoha
(74) Attorney, Agent, or Firm—Mayer, Brown, Rowe & Maw LLP (57) ABSTRACT

A reference voltage generating circuit of a non-volatile ferroelectric memory device includes a temperature compensating control circuit that increases and outputs a level of a signal to a reference capacitor node according to an increase in temperature when a reference control signal is at a high level, a plurality of ferroelectric capacitors connected in parallel, each of first electrodes of the plurality of ferroelectric capacitors are commonly connected to a ground voltage terminal and each of second electrodes of the plurality of ferroelectric capacitors are commonly connected to the reference capacitor node, and a plurality of switching blocks controlled by a reference wordline signal, each having drain terminals commonly connected to the reference capacitor node, source terminals connected to a corresponding bitline.

12 Claims, 8 Drawing Sheets

P : electric charge
V : electric field

P : electric charege
V : electric field

REFERENCE VOLTAGE GENERATING CIRCUIT OF NONVOLATILE FERROELECTRIC MEMORY DEVICE

The present invention claims the benefit of the Korean Patent Application No. P2001-47263 filed in Korea on Aug. 6, 2001, which is hereby incorporated by reference.

BACKGROUND OF THE INVENTION

1. Field of the Invention

The present invention relates to a semiconductor memory device, and more particularly, to a reference voltage generating circuit of a nonvolatile ferroelectric memory device.

2. Background of the Related Art

In general, a nonvolatile ferroelectric memory device such as a ferroelectric random access memory (FRAM), for example, has a data processing speed equivalent to that of a dynamic random access memory (DRAM), and the nonvolatile ferroelectric memory device retains data during a power OFF state. Accordingly, the nonvolatile ferroelectric memory devices are commonly considered to be one of a next generation of memory devices.

The FRAM and DRAM are memory devices with similar structures, but the FRAM includes a ferroelectric capacitor having high residual polarization characteristics. The residual polarization characteristics permit the retention of data when an applied electric field is removed.

Figure 1:
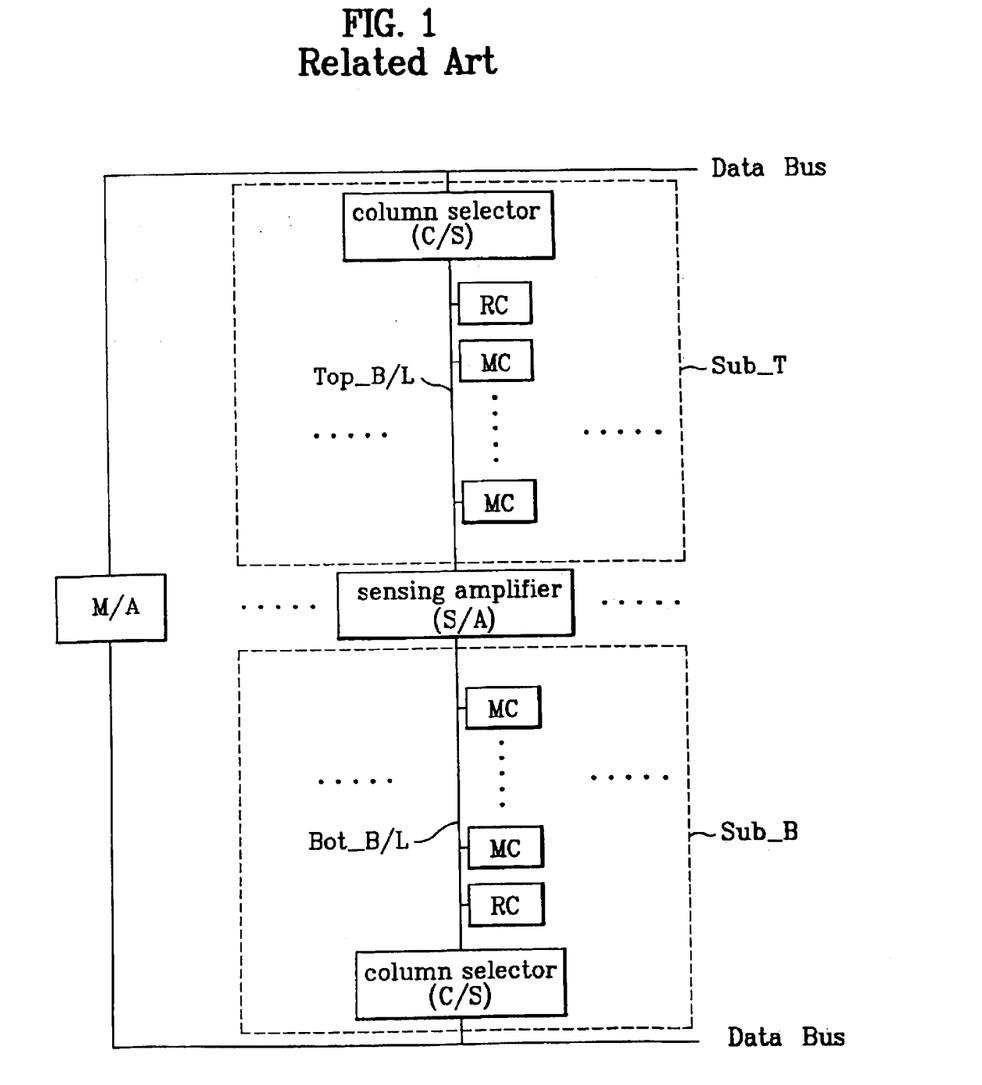
FIG. 1 is a circuit diagram illustrating a cell array according to the related art.
Figure 2:
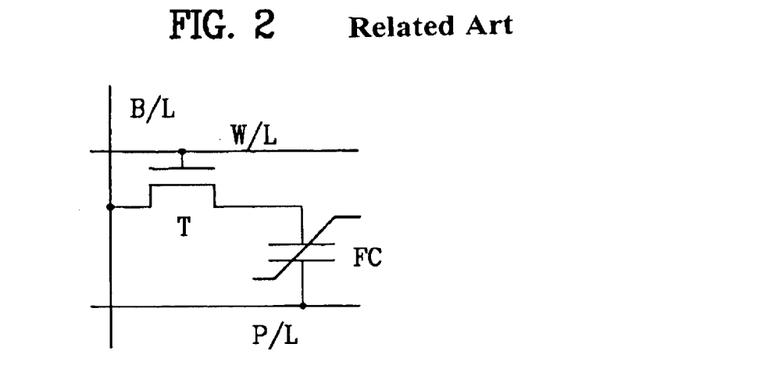
FIG. 2 illustrates a unit circuit diagram of a main cell in FIG. 1.
Figure 3:
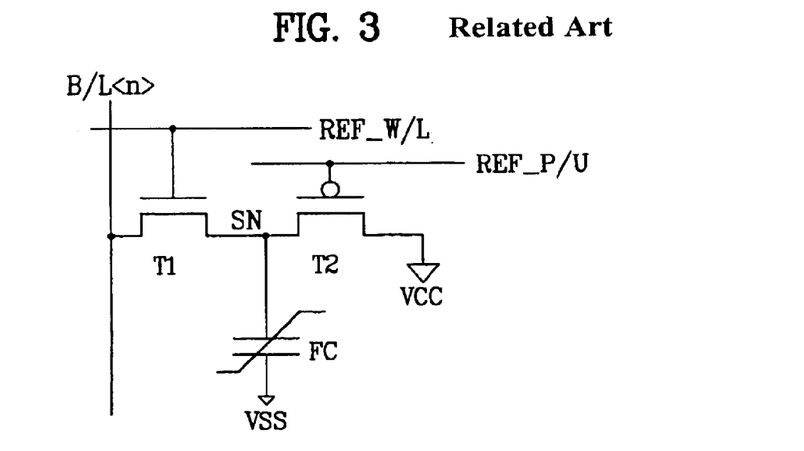
FIG. 3 illustrates a unit circuit diagram of a reference cell according to the related art.

FIG. 1 is a circuit diagram illustrating a cell array according to the related art, FIG. 2 illustrates a unit circuit diagram of a main cell of FIG. 1, and FIG. 3 is a unit circuit diagram of a reference cell according to the related art.

In FIG. 1, a cell array block includes a plurality of sub cell arrays. A sensing amplifier S/A is formed between adjacent top and bottom sub cell arrays sub_T and sub_B. Each of the sub cell arrays includes bitlines Top_B/L and Bot_B/L, a plurality of main cells MC connected to the bitlines Top_B/L and Bot_B/L, a reference cell RC connected to the bitlines Top_B/L and Bot_B/L, and a column selector CS. The reference cell RC within the sub cell array sub_T formed in a top portion of the sensing amplifier S/A is simultaneously accessed when the main cell M/C within the sub cell array sub_B is accessed. On the other hand, the reference cell RC within the sub cell array sub_B formed in a bottom portion of the sensing amplifier S/A is simultaneously accessed when the main cell MC within the sub cell array sub_T is accessed. The column selector CS selectively activates a corresponding column bitline using Y (column) address. If the column selector CS is in high level, the corresponding column bitline is connected to a data bus, so as to enable data transmission.

In FIG. 2, the main cell MC is formed by having a bitline B/T formed in one direction, and a wordline W/L formed to cross the bitline. A plate line P/L is spaced apart from the wordline W/L in the same direction as the wordline W/L. A transistor T with a gate connected to the wordline W/L and a source connected to the bitline B/L is formed. A ferroelectric capacitor FC is formed in such a manner that its first terminal is connected to a drain of the transistor T and its second terminal is connected to the plate line P/L.

In FIG. 3, each of the reference cells of the nonvolatile ferroelectric memory device includes a bitline B/L formed in one direction, a reference wordline REF_W/L formed across the bitline, and a switching block controlled by a signal of the reference wordline to selectively transmit a reference voltage stored in the ferroelectric capacitors bitline. A level initiating block selectively initiates a level of input terminal of the switching block connected to the ferroelectric capacitors. Ferroelectric capacitors FC are formed between a connection node SN of the switching block and the level initiating block and a ground voltage terminal Vss.

The switching block includes an NMOS transistor (hereinafter, referred to as first transistor T1) with a gate connected to the reference wordline REF_W/L, a drain connected to the bitline B/L<n>, and a source connected to a storage node SN.

The level initiating block is controlled by a reference cell pull-up control signal REF_P/U which is a control signal for initiating the storage node SN of the reference cell. Also, the level initiating block includes a PMOS transistor (hereinafter, referred to as second transistor T2) connected between the source of the first transistor T1 and a power source voltage Vcc.

A first electrode of the ferroelectric capacitor is connected to the source of the first transistor T1 and a second electrode is connected to the reference plate line REF_P/L.

The second transistor T2 is turned on upon receiving a "low" signal, thereby initiating the storage node SN to a "high" level.

Figure 4:
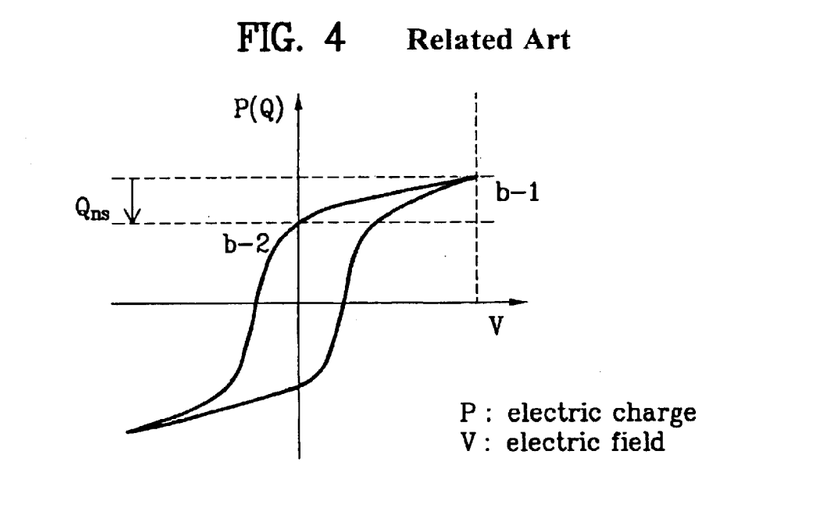
FIG. 4 is a hysteresis loop illustrating electric charge generation of a reference cell according to the related art.

FIG. 4 is a hysteresis loop illustrating electric charge generation of the reference cell according to the related art. In FIG. 4, a reference level is generated in the bitline by sending out non-switching (destruct) charge Qns of the ferroelectric capacitor to the bitline. The non-switching charge Qns is generated while moving from point b-1 to point b-2.

Figure 5:
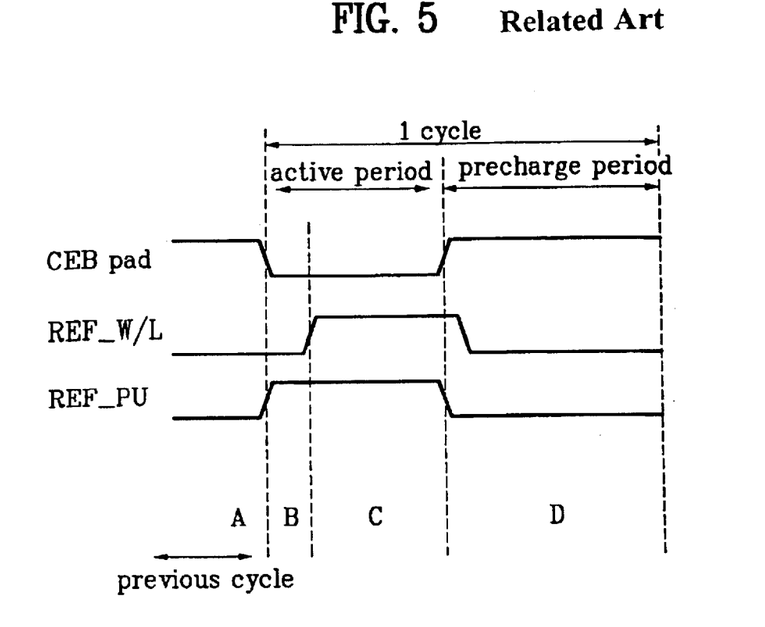
FIG. 5 is a timing chart showing the operation of a reference cell according to the related art.

FIG. 5 illustrates an operation of the reference cell according to the related art, whereby one cycle consists of an active period and a precharge period. The active period begins as a chip enable pad CEBpad is transited to a "low" level, and is completed after passing through the precharge period. Period A is the precharge period of a previous cycle. In addition, when the active period of a chip begins, an address is decoded during period B, and as a plurality of control signals are activated, the reference wordline REF_W/L and the reference plate line REF_P/L are transited from a "low" level to a "high" level. Furthermore, with the beginning of period C, the reference wordline REF_W/L and the reference plate line REF_P/L are sequentially transited from a "low" level to a "high" level, thus a "high" data of the reference cell is transmitted to each bitline. The reference pull-up signal REF_P/U is once again transited to a "low" level during precharge period D. During the other periods, the reference pull-up signal REF_P/U is maintained at a "low" level, thus enabling a storage node SN of the ferroelectric capacitor to be at a "high" state.

The aforementioned related art circuit for generating reference voltage of a nonvolatile ferroelectric memory device has the following disadvantage. In accordance with the operation temperature, the reference level is inconsistent and varies greatly between Qns and Qns*. As the temperature increases, the reference level shows the characteristic of decreasing, thereby decreasing a sensing margin.

SUMMARY OF THE INVENTION

Accordingly, the present invention is directed to a reference voltage generating circuit of a nonvolatile ferroelectric memory device that substantially obviates one or more problems due to limitations and disadvantages of the related art.

An object of the present invention is to provide a reference voltage generating circuit of a nonvolatile ferroelectric memory device that improves a sensing margin by allowing the reference level increase in accordance with the increase in temperature.

Additional features and advantages of the invention will be set forth in part in the description which follows, and in part will be apparent from the description, or may be learned by practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a reference voltage generating circuit of a non-volatile ferroelectric memory device includes a temperature compensating control circuit that increases and outputs a level of a signal to a reference capacitor node according to an increase in temperature when a reference control signal is at a high level, a plurality of ferroelectric capacitors connected in parallel, each of first electrodes of the plurality of ferroelectric capacitors are commonly connected to a ground voltage terminal and each of second electrodes of the plurality of ferroelectric capacitors are commonly connected to the reference capacitor node, and a plurality of switching blocks controlled by a reference wordline signal, each having drain terminals commonly connected to the reference capacitor node, source terminals connected to a corresponding bitline.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 8:
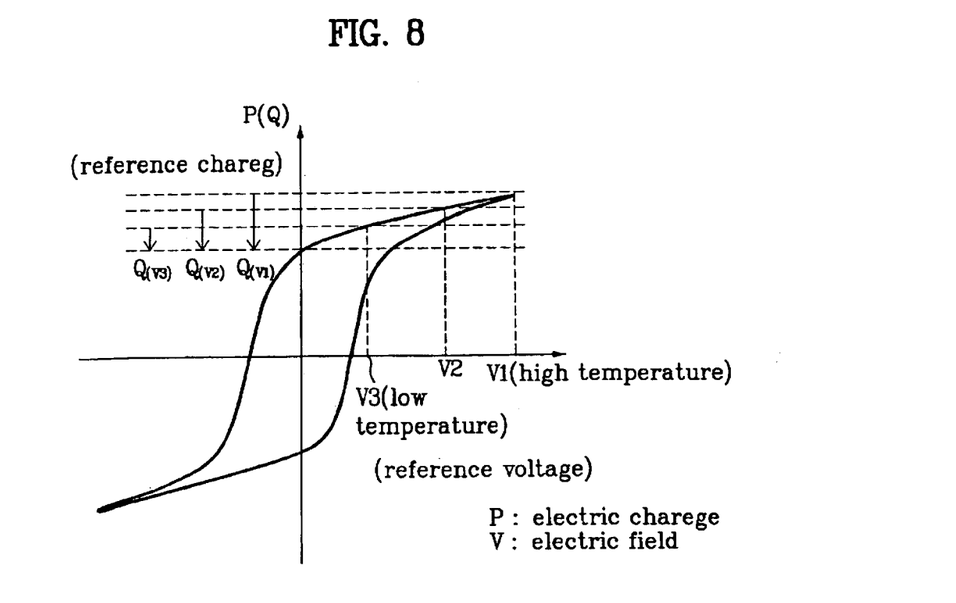
FIG. 8 is an exemplary hysteresis loop illustrating a relation between a reference voltage and a reference charge of a temperature compensating control circuit according to the present invention.

FIG. 8 is an exemplary hysteresis loop illustrating a relation between a reference voltage and a reference charge of a temperature compensating control circuit according to the present invention. In FIG. 8, a basic principle of generating temperature compensating reference according to the present invention is demonstrated, whereby operation is carried out at a reference generating operation voltage of V1 when the temperature increases, and operation is carried out at a reference generating operation voltage of V2 and V3 when the temperature decreases. Accordingly, the amount of Q(V1) of reference charge is generated at the voltage of V1, and the amounts of Q(V2) and Q(V3) of reference charge are generated at voltages of V2 and V3, respectively. Moreover, by controlling the reference generating operation voltage differently at the reference voltage generating circuit, the corresponding reference charges are also controlled differently.

Figure 9:
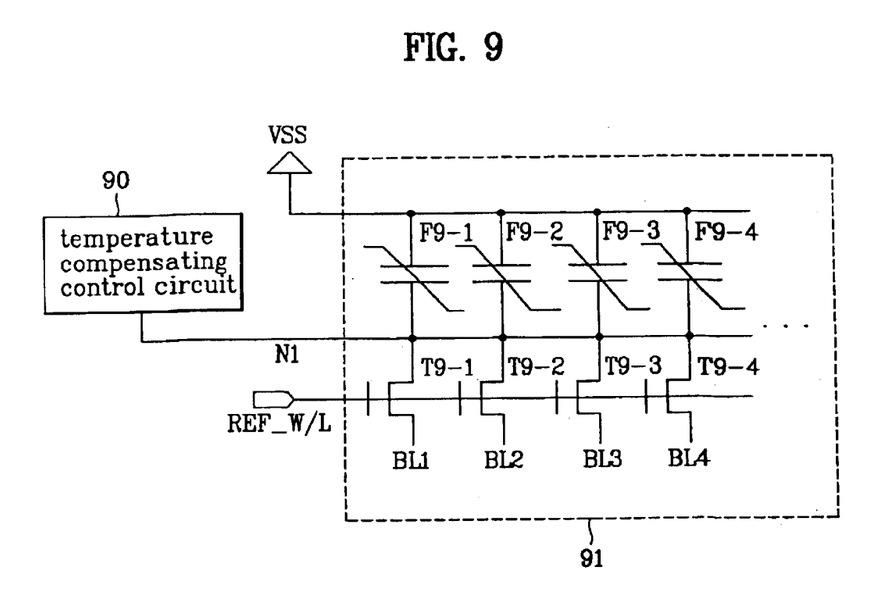
FIG. 9 illustrates an exemplary reference voltage generating circuit of a semiconductor memory device according to the present invention.

FIG. 9 illustrates an exemplary reference voltage generating circuit of a semiconductor memory device according to the present invention. In FIG. 9, the reference voltage generating circuit of the non-volatile ferroelectric memory device may include a temperature compensating control circuit 90, and a reference cell array 91 that may include a plurality of reference ferroelectric capacitors and transistors.

The reference cell array 91 may include a plurality of ferroelectric capacitors F9-1, F9-2, F9-3, F9-4, . . . , and F9-n formed in parallel between a first node N1, which receives outputted signals from the temperature compensating control circuit 90, and a ground voltage terminal Vss. The reference cell array 92 may further include a plurality of transistors T9-1, T9-2, T9-3, T9-4, . . . , and T9-n, which operate upon receiving reference wordline (REF_W/L) signals, that have drain terminals commonly connected to the first node N1 and source terminals connected to each bitline BL1, BL2, BL3, BL4, . . . , and BLn.

The structure of the above-described temperature compensating control circuit 90, which operates according to the operating principle shown in FIG. 8, will now be described.

Figure 12:
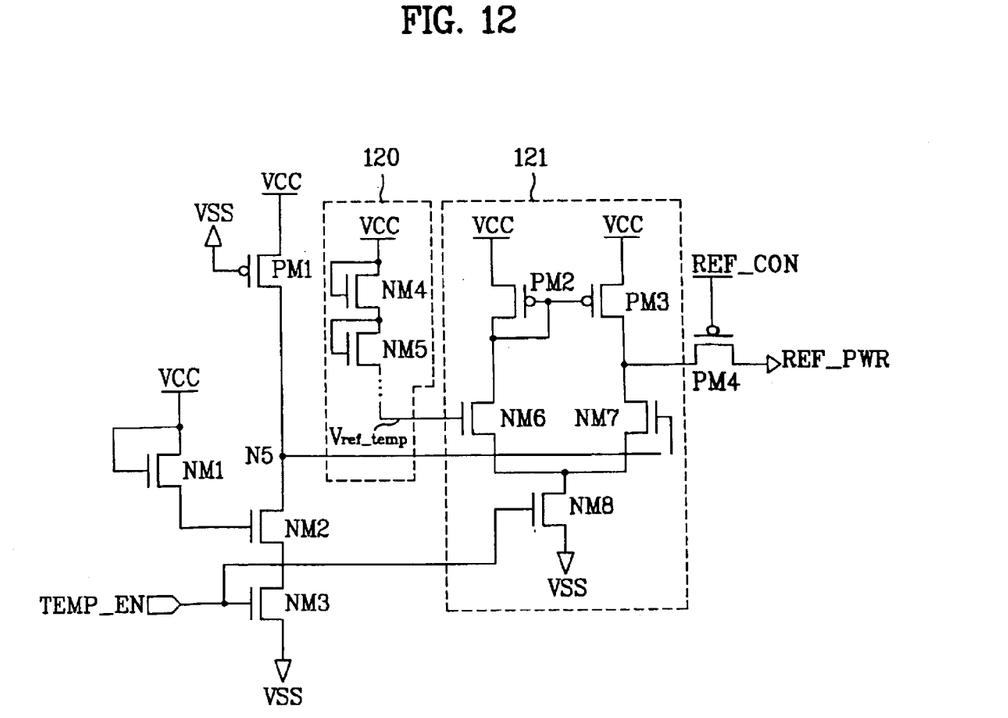
FIG. 12 illustrates a detailed circuit diagram of an exemplary temperature compensating control circuit shown in FIGS. 9, 10, and 11.

As shown in FIG. 12, the temperature compensating control circuit 90 (in FIG. 9) may include a first NMOS transistor NM1 that increases a voltage of a drain node by decreasing a threshold voltage in accordance with an increase in temperature, a second NMOS transistor NM2 that receives an increased signal from the drain node of the first NMOS transistor NM1 in accordance with the increase in temperature enabling the gate voltage to increase and allowing a greater current flow, a third NMOS transistor NM3 that operates as a switching block controlled by a TEMP_EN signal, which is turned ON during an active period of the chip and is turned OFF during the rest of the periods, a first PMOS transistor PM1 that increases a voltage drop by increasing resistance in accordance with an increase in temperature, a reference voltage outputting block 120 having an n number (wherein n is an integer) of NMOS transistors serially connected to a diode so that a voltage of a drain node increases in accordance with an increase in temperature, a differential amplifier 121 that compares the output signal Vref_temp of the reference voltage outputting block with a signal from a fifth node N5 and amplifies the signal, and a fourth PMOS transistor PM4 that acts as a switching block, which is controlled by a reference control signal REF_CON for controlling the charge supply of the reference capacitor node REF_PWR.

The differential amplifier 121 may include a sixth NMOS transistor NM6 that operates upon receiving a Vref_temp signal, a seventh NMOS transistor NM7 that operates upon receiving a signal from the fifth node N5, an eighth NMOS transistor NM8 that operates upon receiving a TEMP_EN signal, a second PMOS transistor PM2 formed between the power source voltage Vcc and a terminal of the sixth NMOS transistor NM6, and a third PMOS transistor PM3, whereby the gate is connected to the second PMOS transistor PM2 and which is formed between the power source voltage Vcc and a terminal of the seventh NMOS transistor NM7. The voltage of the fifth node N5 is determined by a ratio between a resistive element of the second and third NMOS transistors NM2 and NM3 and a resistive element of the first PMOS transistor PM1.

As the temperature increases, a gate voltage of the second NMOS transistor NM2 increases, while the resistance decreases. However, the resistance of the first PMOS transistor PM1 increases, whereas the voltage of the fifth node N5 decreases, in accordance with the increase in temperature. In addition, the drain terminal voltage Vref_temp increases as the temperature increases in the reference voltage outputting block 120, and the voltage decreases as the temperature increases in the fifth node N5. According to the increase in temperature, when the voltage of the fifth node N5 is lower than Vref-temp, a high voltage is outputted from the REF_PWR through the differential amplifier 121. Thus, the reference charge voltage can be controlled differently in accordance with the temperature.

Figure 10:
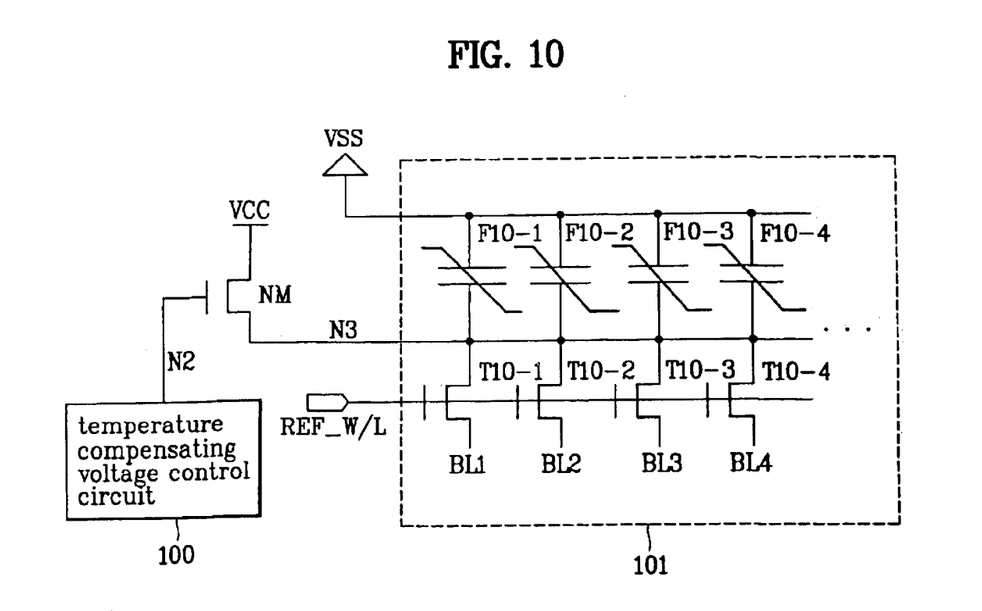
FIG. 10 is another exemplary reference voltage generating circuit diagram of a semiconductor memory device according to the present invention.

FIG. 10 is an exemplary reference voltage generating circuit diagram of a semiconductor memory device according to the present invention. In FIG. 10, the structure of the reference voltage generating circuit according to the present invention may be formed of a temperature compensating voltage control circuit 100, a switching transistor NM, and a reference cell array 101. The reference cell array 101 in FIG. 10 may have a similar structure as the reference cell array 91 in FIG. 9, and the temperature compensating voltage control circuit 100 and the switching transistor NM in FIG. 10 may correspond to the temperature compensating control circuit 90 in FIG. 9.

The switching transistor in FIG. 10 may receive a signal from a second node N2 through the gate terminal, which may receive an output signal from the temperature compensating voltage control circuit 100, and may be formed between the power source voltage Vcc and the reference cell array 101. At a low temperature, a voltage of a second node N2 may be controlled to have a voltage lower than when at a high temperature. Therefore, a voltage of a third node N3, which is inputted to the reference cell array 101, may be controlled to have a low voltage. As the third node N3 may be controlled in accordance with the temperature, the charge stored at the reference capacitor of the reference cell array 101 may also be controlled in accordance with the change in temperature.

Figure 11:
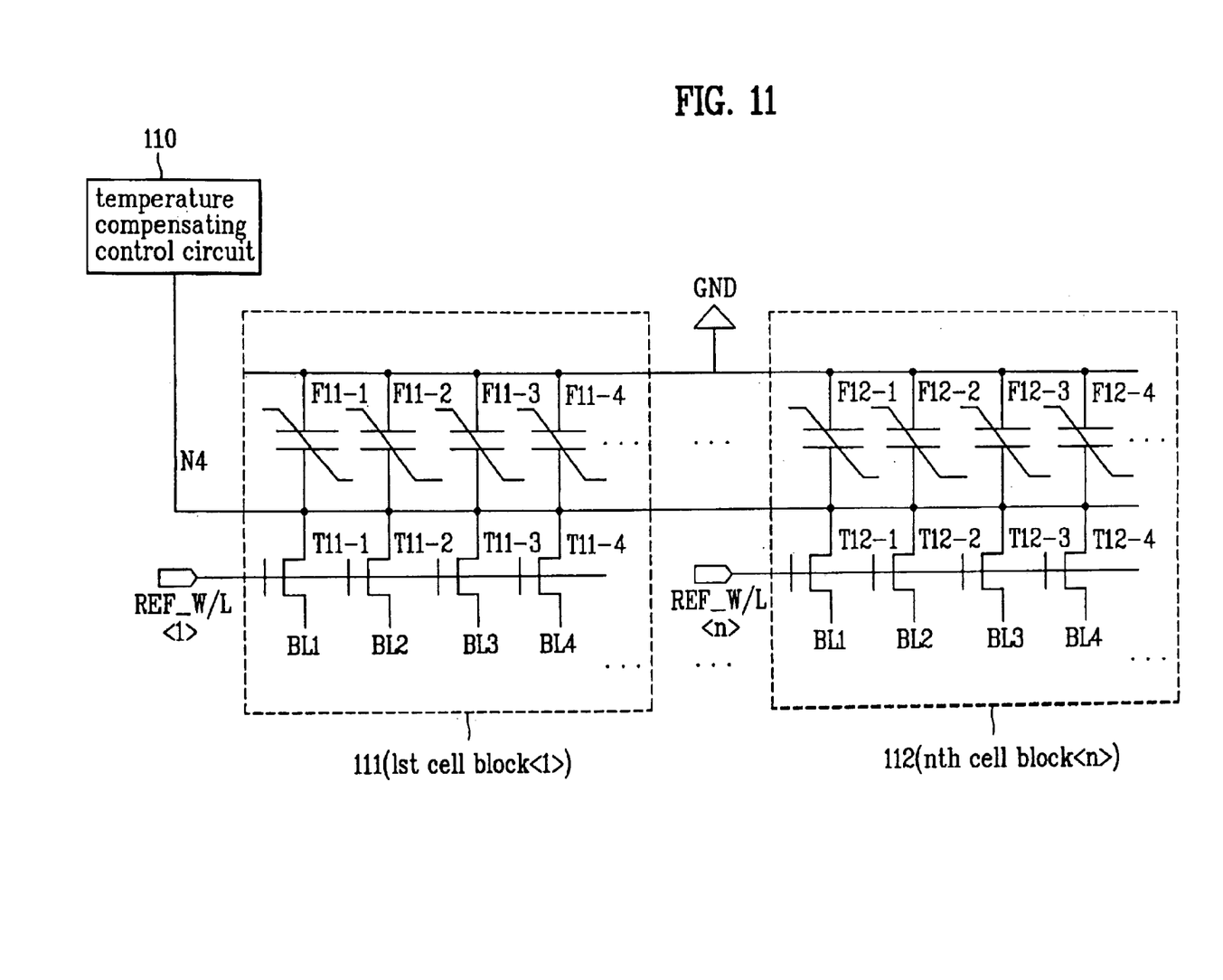
FIG. 11 is another exemplary reference voltage generating circuit diagram of a semiconductor memory device according to the present invention.

FIG. 11 is another exemplary reference voltage generating circuit diagram of a semiconductor memory device according to the present invention. In FIG. 11, the structure of the reference voltage generating circuit according to the present invention may be formed of a temperature compensating control circuit 110 and an n number (wherein n is an integer) of reference cell array units.

Unlike the exemplary reference voltage generating circuits in FIGS. 9 and 10, which include one reference cell array, the exemplary reference voltage generating circuit in FIG. 11 may be formed of an n number (wherein n is an integer) of reference cell array blocks. Each reference cell array may have similar structures as the reference cell array 91 in FIG. 9. First and second electrodes of reference ferroelectric capacitors of the respective reference cell arrays may be commonly connected to a ground voltage to a fourth node N4, respectively, wherein the fourth node N4 receives output signals of the temperature compensating control circuit 110. In additional, gate terminals of the first to $n^{th}$ reference cell array may be enabled upon receiving signals from the first to $n^{th}$ reference wordlines REF_W/L<1>, REF_W/L<2>, . . . , REF_W/L<n>.

A size of the reference ferroelectric capacitors implemented in one reference cell array may also be used in the reference ferroelectric capacitors of the other reference cell arrays. Accordingly, the size of each reference ferroelectric capacitor can be reduced, thereby decreasing the amount of current consumption.

In FIG. 11, a plurality of reference cell arrays are commonly connected to the fourth node N4, and only the cell array selecting reference wordline REF_W/L is controlled separately. Accordingly, at a low temperature, the fourth node N4 of the reference voltage generating circuit may be controlled to have a lower voltage than when at a higher temperature. Therefore, the charge which is stored at the reference ferroelectric capacitor can also be controlled in accordance with the change in temperature.

Figure 13:
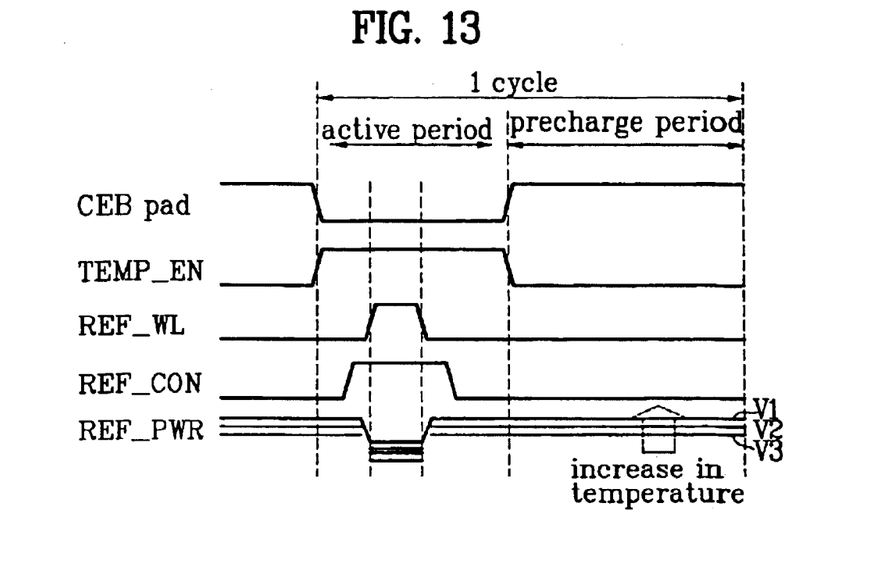
FIG. 13 is a timing chart illustrating an exemplary operation of the temperature compensating control circuit of FIG. 12.
Figure 14:
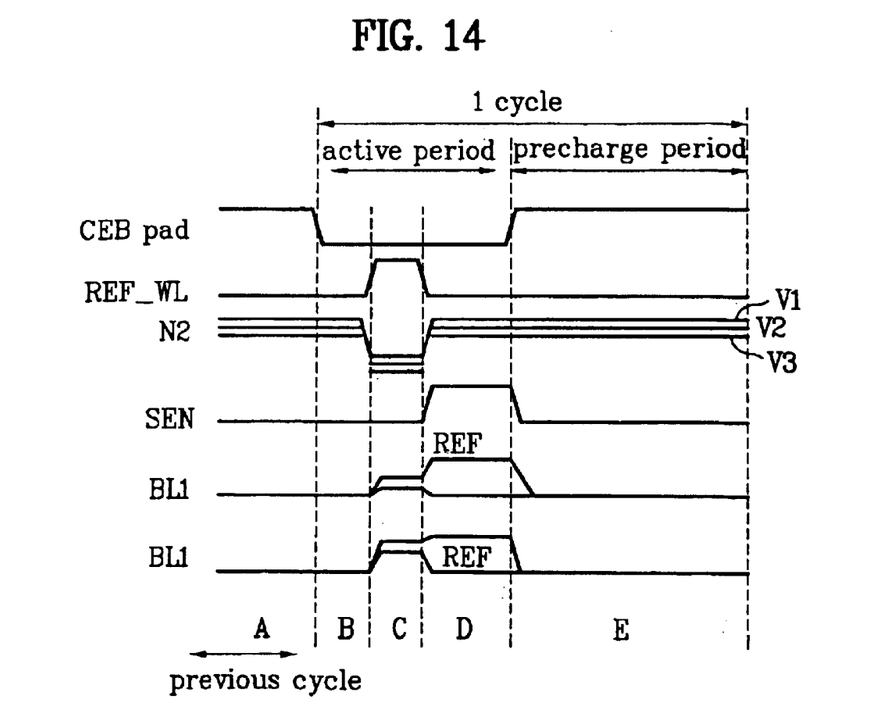
FIG. 14 is a timing chart illustrating an exemplary operation of the reference cell of FIG. 9.

The operation of the reference voltage generating circuit of the non-volatile ferroelectric memory device of the present invention will now be described. As shown in FIGS. 10, 13, and 14, one cycle may include an active period and a precharge period, wherein the cycle begins as a chip enable signal CEBpad when transited to "low." Accordingly, when the active period of the chip begins, an address is decoded in period B, and as diverse control signals are activated, the reference wordline REF_W/L is transited from a "low" level to a "high" level. As the reference wordline REF_W/L is transited from a "low" level to a "high" level in period C, data of the reference ferroelectric capacitor may be transmitted to each bitline.

The second node N2 in FIG. 10 may be in a floating state only in period C, and as the temperature increases in the rest of the periods A, B, D, and E, the reference control voltage also becomes V3, V2, and V1. In this case, the relative voltages may be V3<V2<V1. The reference wordline REF_W/L is at a "high" level only in period C, and at a "low" level in the rest of the periods A, B, D, and E. A sense enable signal SEN, which is an active signal from the bitline sensing amplifier, activates the sensing amplifier to a "high" level during period D. Therefore, the main cell data and reference cell data may be transmitted during period C, and the bitline data may be amplified by the sense enable signal SEN during period D.

During a charge and a discharge of the ferroelectric capacitor, temperature and voltage dependency may become higher. Therefore, when the capacitor is being charged, the reference voltage in periods A and B may control the corresponding temperature dependency. Additionally, when the capacitor is being discharged, the reference voltage in period C may control the corresponding temperature dependency in period C.

The signal output to the second node N2 by the temperature compensating voltage control circuit (the temperature compensating control circuit) will now be described with reference to FIGS. 12 and 13. In FIGS. 12 and 13, the chip enable signal may be activated to a "low" level during the active period. The TEMP_EN signal, which controls the third NMOS transistor NM3, may be activated to a "high" level. The reference control signal REF_CON may be activated to a "high" level. While the reference wordline REF_W/L is at "high" level, the reference capacitor node REF_PWR may output a high voltage as the temperature increases. Accordingly, as shown in FIG. 8, V1, V2, and V3 of FIG. 13 may be expressed V1>V2>V3.

The change in reference level of the present invention having the aforementioned structure in accordance with the temperature will now be compared with the change in reference level of the related art.

Figure 6:
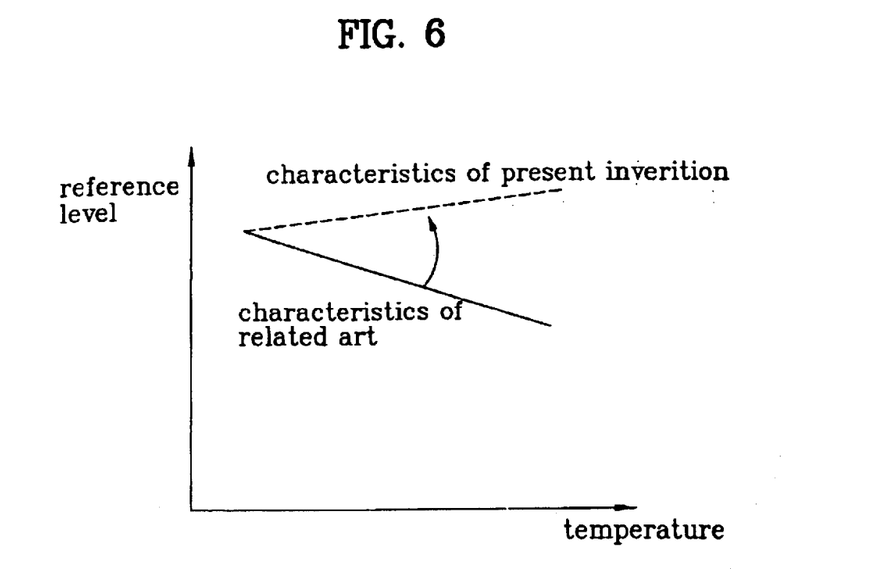
FIG. 6 is a chart illustrating a change in characteristics in the reference level in accordance with a change in temperature in the related art and according to the present invention.
Figure 7:
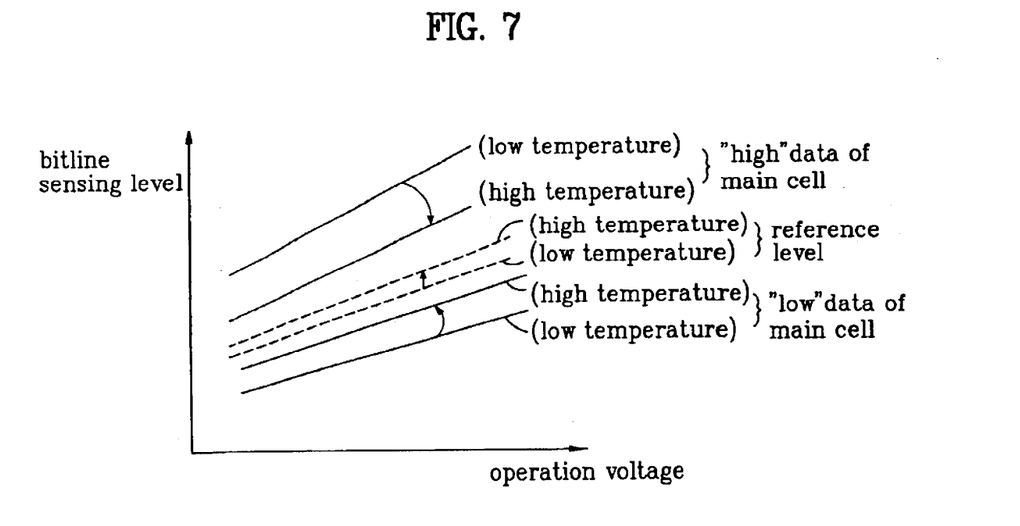
FIG. 7 is a chart illustrating temperature dependency of a bitline sensing level according to the operating voltage of both the related art and according to the present invention.

FIG. 6 illustrates the amount of change in reference level of the present invention and that of the related art in accordance with the temperature. In the related art, the reference level shows the characteristic of decreasing when the temperature increases. On the other hand, in the present invention, the reference level shows the characteristics increasing along with the increase in temperature. In additional, FIG. 7 shows the bitline sensing level in accordance with the operation voltage. The "low" data of the main cell increase accordingly as the temperature increases. The reference level data of the present invention also increase accordingly as the temperature increases.

It will be apparent to those skilled in the art that various modifications and variations can be made in the reference voltage generating circuit of the present invention without departing from the spirit or scope of the invention. Thus, it is intended that the present invention cover the modifications and variations of this invention provided they come within the scope of the appended claims and their equivalents.

What is claimed is:

1. A reference voltage generating circuit of a non-volatile ferroelectric memory device, comprising:

a temperature compensating control circuit that increases and outputs a level of a signal to a reference capacitor node according to an increase in temperature when a reference control signal is at a high level;

a plurality of ferroelectric capacitors connected in parallel, each of first electrodes of the plurality of ferroelectric capacitors are commonly connected to a ground voltage terminal and each of second electrodes of the plurality of ferroelectric capacitors are commonly connected to the reference capacitor node; and a plurality of switching blocks controlled by a reference wordline signal, each having drain terminals commonly connected to the reference capacitor node, source terminals connected to a corresponding bitline.

2. The reference voltage generating circuit according to claim 1, wherein the temperature compensating control circuit includes:

a first switching device increasing a voltage of a drain node by decreasing a threshold voltage according to the increase in temperature;

a second switching device receiving a signal from the drain node of the first switching device according to the increase in temperature to allow a second current flow greater than a first current flow before the increase in temperature;

a third switching device connected to a drain terminal of the second switching device to allow a switching operation upon receiving a control signal, the third switching device is enabled only during an active period of a chip;

a fourth switching device connected to a source of the second switching device whereby a voltage drop increases due to an increase in resistance according to the increase in temperature;

a reference voltage output block having an N number of transistors serially connected to a diode so that a voltage of drain terminals of the N number of transistors increases in accordance with the increase in temperature;

a differential amplifier comparing an output signal of the reference voltage output block with a signal sent to a source terminal of the second switching device, and amplifying the signal; and a fifth switching block sending an output signal of the differential amplifier to the reference capacitor node under the control of a reference control signal.

3. The reference voltage generating circuit according to claim 2, wherein the first switching device includes an NMOS transistor connected to a diode.

4. The reference voltage generating circuit according to claim 2, wherein the second and third switching devices include NMOS transistors.

5. The reference voltage generating circuit according to claim 2, wherein the fourth and fifth switching devices include PMOS transistors.

6. The reference voltage generating circuit according to claim 1, further comprising a switching transistor for increasing signal transmission speed between the temperature compensating control circuit and the reference capacitor node.

7. The reference voltage generating circuit according to claim 6, wherein the switching transistor is controlled by an output signal of the temperature compensating control circuit and includes an NMOS transistor having one electrode connected to a power source terminal Vcc and the other electrode connected to the reference capacitor node.

8. A reference voltage generating circuit of a non-volatile ferroelectric memory device, comprising:

a temperature compensating control circuit that increases and outputs a level of a signal to a reference capacitor node according to an increase in temperature when a reference control signal is at a high level; and a plurality of reference cell arrays each having a plurality of ferroelectric capacitors and a plurality of switching blocks controlled by a reference wordline signal, each of the ferroelectric capacitors are connected in parallel with first electrodes commonly connected to a ground voltage terminal and second electrodes commonly connected to the reference capacitor node, and each switching block has first terminals commonly connected to the reference capacitor node and second terminals connected to bitlines.

9. The reference voltage generating circuit according to claim 8, wherein the temperature compensating control circuit includes:

a first switching device increasing a voltage of a drain node by decreasing a threshold voltage according to an increase in temperature;

a second switching device receiving a signal from the drain node of the first switching device according to the increase in temperature to allow a second current flow greater than a first current flow before the increase in temperature;

a third switching device connected to a drain terminal of the second switching device to allow a switching operation upon receiving a control signal, the third switching device is enabled only during an active period of a chip;

a fourth switching device connected to a source of the second switching device whereby a voltage drop increases due to an increase in resistance according to the increase in temperature;

a reference voltage output block having an N number of transistors serially connected to a diode so that a voltage of drain terminals of the N number of transistors increases in accordance with the increase in temperature;

a differential amplifier comparing an output signal of the reference voltage output block with a signal sent to a source terminal of the second switching device, and amplifying the signal; and a fifth switching block sending an output signal of the differential amplifier to the reference capacitor node under the control of a reference control signal.

10. The reference voltage generating circuit according to claim 9, wherein the first switching device includes an NMOS transistor connected to a diode.

11. The reference voltage generating circuit according to claim 9, wherein the second and third switching devices include NMOS transistors.

12. The reference voltage generating circuit according to claim 9, wherein the fourth and fifth switching devices include PMOS transistors.

* * * * *